(12) United States Patent
Ma

(10) Patent No.: US 7,071,724 B2
(45) Date of Patent: Jul. 4, 2006

(54) WAFER PROBECARD INTERFACE

(75) Inventor: David Suitwai Ma, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/877,299

(22) Filed: Jun. 25, 2004

(65) Prior Publication Data

US 2005/0285614 A1    Dec. 29, 2005

(51) Int. Cl.
*G01R 31/02* (2006.01)
*H05K 1/11* (2006.01)

(52) U.S. Cl. .................. 324/765; 324/754; 324/758; 439/66

(58) Field of Classification Search ............... 324/754, 324/750–765
See application file for complete search history.

(56) References Cited

U.S. PATENT DOCUMENTS

| | | | |
|---|---|---|---|
| 6,624,646 B1 * | 9/2003 | Zaiser | 324/754 |
| 6,707,065 B1 | 3/2004 | Fenner et al. | |
| 6,812,718 B1 * | 11/2004 | Chong et al. | 324/754 |
| 6,847,218 B1 * | 1/2005 | Nulty et al. | 324/754 |
| 2002/0132501 A1 * | 9/2002 | Eldridge et al. | 439/66 |
| 2004/0223309 A1 * | 11/2004 | Haemer et al. | 361/767 |

* cited by examiner

*Primary Examiner*—Vinh Nguyen
*Assistant Examiner*—Emily Y Chan
(74) *Attorney, Agent, or Firm*—Patterson & Sheridan, L.L.P.

(57) ABSTRACT

Apparatus and method for testing a device wafer having a plurality of devices formed thereon. One embodiment of the invention provides an interface wafer comprising a plurality of contact pads disposed on a first surface for contacting a plurality of device pads on the device wafer and a plurality of interface pads disposed on a second surface for contacting probe needles on a probe card, wherein the plurality of interface pads are electrically connected to the plurality of contact pads and wherein the plurality of interface pads are disposed in a relaxed-pitch arrangement as compared to the plurality of contact pads.

18 Claims, 8 Drawing Sheets

WAFER PROBECARD INTERFACE

BACKGROUND OF THE INVENTION

1. Field of the Invention

The present invention generally relates to an apparatus and method for testing a device wafer having a plurality of devices formed thereon, and more particularly, to an interface for connecting a probe card of a testing system to device pads on a device wafer.

2. Description of the Related Art

In conventional semiconductor manufacturing, a plurality of integrated circuits or devices are formed on a semiconductor substrate or wafer, and after completing the fabrication processes, the devices formed on the wafer may be cut from the wafer and packaged into individual chips, which are then tested individually to ensure that each chip performs according to certain specification. To reduce costs associated with testing chips individually, the devices formed on the wafer may be tested prior to being separated into individual chips. Conducting tests on devices formed on a wafer improves cost efficiencies generally and also facilitates sales of devices on a wafer level (i.e., sales of device wafers).

Currently, to test a wafer having a plurality of devices formed thereon, a probe card having a plurality of probe needles is utilized to provide physical contact with a plurality of device pads of the devices formed on the device wafer. Device pads are electrically conductive pads which are connected to the leads (e.g., input, output, reference voltage, ground, etc.) of the devices. In conventional testing systems, the probe needles on the probe card are precisely manufactured to match the device feature sizes and/or the corresponding pitch between device pads. As device feature sizes decrease with improved semiconductor processing techniques, the precision requirement for the probe needles becomes more stringent (e.g., smaller sizes and smaller tolerances), and the direct cost for manufacturing the probe cards/needles increases tremendously because of the strict precision requirement.

Associated with the high cost for manufacturing precision probe needles is a longer lead time needed to manufacture the probe needles. Unless the orders for the probe card are placed far in advance, costly delays between production and testing of the device wafers are likely to occur, which may result in missed market opportunities and/or loss of first product status. However, if an order was placed too far in advance, the probe card may be in production stages that cannot incorporate changes corresponding to additional changes (after the probe-card has been ordered) to the design of the devices to be formed on the wafer.

Furthermore, the probe card and probe needles manufactured for one specific device design on a wafer are generally incompatible (i.e., not reusable) for other device designs with different device sizes or leads. Although the probe needles may be re-worked in some instances to allow some reusability, re-working the probe needles is a slow, tedious and relatively expensive task, and the re-worked probe needles provide lower quality and may become unreliable because of the re-work process.

Another problem encountered in conventional testing systems is that a testing system having one probe card cannot test all devices on a wafer all at once and requires sequential testing of groups of devices, resulting in prolonged testing time and reducing throughput. Because a probe card provides a limited number of probe needles corresponding to the number of available test channels on the tester or testing equipment, the devices formed on the wafer are divided into a plurality of groups for testing purposes. Each group of devices may be tested utilizing one probe card, and the testing processes are repeated for each group of devices. Because all of the devices on the wafer cannot be tested at the same time (e.g., cannot be tested with the same touchdown), some tests may require excessively long time periods to complete, particularly with tests such as burn-in tests which may require days to complete for all devices on a wafer. Such excessive time requirements for performing device testing substantially reduces production efficiencies and throughput. Furthermore, a probe card may require an excessive number of touchdowns on the device pads on the wafer, which may result in damages to the devices formed on the wafer.

Another problem associated with testing of device wafers relates to the increasing design-for-test (DFT) features included on-chip for testing and manufacturing. DFT features are components or circuits which are designed and utilized specifically for testing the devices, but generally not utilized in normal operation of the devices. As more DFT features are included on-chip, the area or space required to implement the on-chip DFT features increases along with the additional design effort required to accommodate all components of the device in a limited substrate area. Also, the performance of the device may be hindered due to the on-chip DFT features. Thus, the additional effort required for implementing the DFT features on-chip have resulted in a reduction in the savings and utility of having the DFT features on-chip.

Current solutions to reduce design effort needed to incorporate the DFT features into a new device design are based on re-using previously designs of DFT features. However, substantial efforts from one or more DFT designers and layout designers are required to make adjustments to incorporate the previously designed DFT features into a new device design and run full verification to ensure that no mistakes were made in re-using previously designed DFT features. Another current solution for incorporating increased DFT features minimizes the required substrate area for the DFT features by providing more efficient layout or feature design. However, this is usually done as an after-thought because priority to optimize DFT features is low as compared to the need to optimize the main device performance.

In addition to the substrate area consumed by the components for implementing the DFT features, a significant proportional amount of metal signal routing area is also required by the DFT features. This becomes especially critical in areas where congestions for routing normal operation signal already exist, resulting in increased layout time, weakened power rails and/or weakened device operation signal. The performance impact to normal operation is usually minimized by isolating DFT blocks with pass gates or logic gates. However, the performance impact to normal operation has also become difficult to control as the number of DFT features grows and complexity increases.

As sales of devices at the wafer level become more prevalent, the probe card cost has also become an increasingly important part of the test cost. Therefore, there exists a need for an apparatus and method which reduce the precision requirement of the probe cards utilized in testing systems for conducting wafer level tests. There is also a need for an apparatus and method which allow a single probe card design to be utilized for testing a variety of device designs. Additionally, there is a need to reduce or minimize the number of touchdowns on device pads required to complete testing of the devices on the wafer. Furthermore, there is a need to improve efficiencies in both testing time and probe card manufacturing cost. There is also a need for an apparatus and method for reducing the production test costs by increasing throughput per tester. Also, there exists a need for an implementation of the DFT features that minimizes the impact on the device performance and reduces the design efforts required to incorporate DFT features.

SUMMARY OF THE INVENTION

Embodiments of the present invention generally provide apparatuses and methods for testing a device wafer having a plurality of devices formed thereon. One embodiment of the invention provides an interface wafer which serves as an interface between a device wafer having a plurality of devices formed thereon to be tested and a probe card of a testing system. In one embodiment, the interface wafer reduces the precision requirement of the probe cards utilized in testing systems for conducting wafer level tests. Additionally, in one embodiment, the interface wafer reduces or minimizes the number of touchdowns on device pads required to complete testing of the devices on the wafer. Furthermore, in one embodiment, the interface wafer improves efficiencies in both testing time and probe card manufacturing cost. Another embodiment of the invention provides an interface wafer which allows a single probe card design to be utilized for testing a variety of device designs.

Another embodiment provides a parallel test interface wafer and a method for performing parallel testing of devices formed on a device wafer. The parallel test interface wafer enables parallel testing of devices formed on a device wafer in a single touchdown which may achieve higher throughput in production testing. Particularly, the parallel test interface wafer may improves efficiency in conducting burn-in tests performed at the wafer level.

Yet another embodiment provides a test circuitry wafer which incorporates design-for-test features that are typically implemented on-chip and simplifies device designs by removing the design-for-test features from the device/chip. Removal of some or all DFT features from the devices on the wafer to the test circuitry wafer reduces the substrate areas and routing space allocated to accommodate the DFT features on the device wafer. Furthermore, the devices one the device wafer may be designed to allow stronger power rails, and signal routing between components within each device may be designed more efficiently because of the removal of the DFT features from the devices. Another advantage achieved by removing the DFT feature off-chip is that the performance impact to normal operation caused by the on-chip DFT blocks is minimized or substantially reduced because the DFT features are moved off-chip.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally provide apparatuses and methods for testing a device wafer having a plurality of devices formed thereon. One embodiment provides an interface wafer which serves as an interface between a device wafer having a plurality of devices formed thereon to be tested and a probe card of a testing system. Another embodiment provides a parallel test interface wafer which facilitates parallel testing of devices formed on a device wafer. Yet another embodiment provides a test circuitry wafer which incorporates design-for-test features that are typically implemented on-chip and simplifies device designs by removing the design-for-test features from the device/chip.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention may provide numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Interface Wafer

One embodiment of the invention provides an interface wafer which serves as an interface between a device wafer having a plurality of devices formed thereon to be tested and a probe card of a testing system. In one embodiment, the interface wafer 100 comprises a semiconductor substrate (e.g., a silicon substrate) which may be the same size and material as the substrates or wafers utilized for producing integrated circuit devices. In one embodiment, the interface wafer 100 includes a first surface (e.g., bottom surface) having a plurality of contact pads for contacting a plurality of device pads on the device wafer and a second surface (e.g., top surface) having a plurality of interface pads for contacting a plurality of probe needles on a probe card utilized for testing the device wafer.

Figure 1:
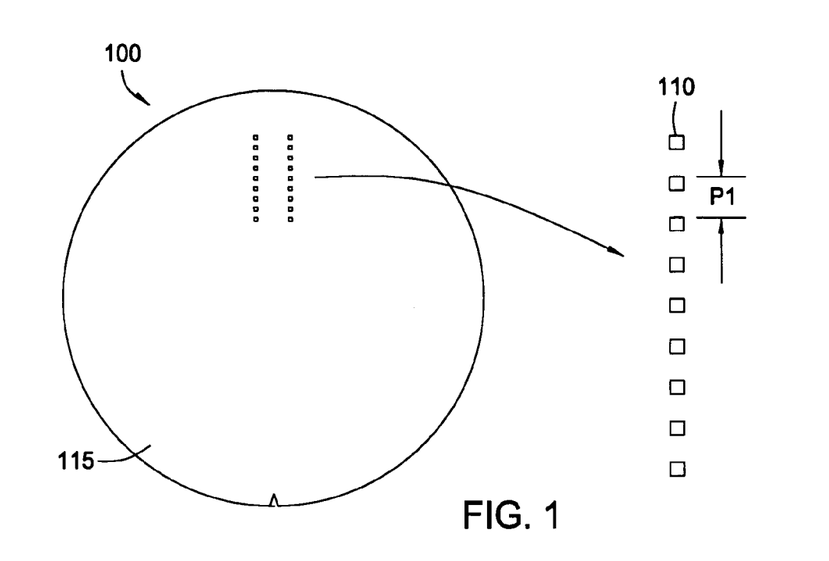
FIG. 1 is a top view of an interface wafer illustrating a plurality of interface pads according to one embodiment of the invention.

FIG. 1 is a bottom view of an interface wafer 100 illustrating a plurality of contact pads 110 according to one embodiment of the invention. The contact pads 110 disposed on the first surface (e.g., bottom surface 115) of the interface wafer are positioned in an arrangement (in a first pitch P1) corresponding to the device pads formed on a top surface of a device wafer to be tested. In one embodiment, the contact pads 110 provide a one-to-one correspondence with the device pads on the device wafer. In another embodiment, the contact pads are only provided for some of the device pads. The contact pads 110 are electrically connected to the interface pads disposed on an opposite surface of the interface wafer 100.

Figure 2:
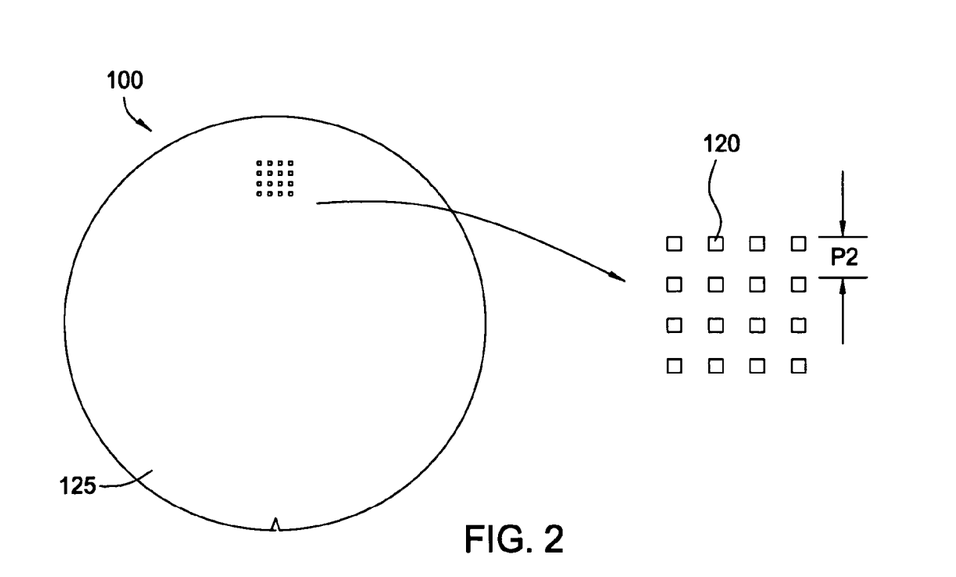
FIG. 2 is a bottom view of an interface wafer illustrating a plurality of contact pads according to one embodiment of the invention.

FIG. 2 is a top view of the interface wafer 100 illustrating a plurality of interface pads 120 according to one embodiment of the invention. The interface pads 120 disposed on the second surface (e.g., top surface 125) of the interface wafer 100 provide electrical contact surfaces for engaging a plurality of probe needles on a probe card connected to a tester. The interface pads 120 are arranged in a relaxed-pitch (i.e., comparatively larger pitch) arrangement in a first pitch P2 as compared to the arrangement of the contact pads 110 so that the probe needles on a probe card may also be arranged in a relaxed-pitch arrangement. The interface pads 120 may be arranged to utilize the entire second surface of the interface wafer 100 and sized to provide larger contact surfaces for engaging probe needles as compared to the size and position of the device pads on the device wafer. Thus, the probe needles on the probe card may be made without a stringent precision requirement as that required for contacting device pads having small pitch (e.g., sub-micron pitch), particularly as the pitch of the device pads have decreased to less than 150 nm.

Figure 3:
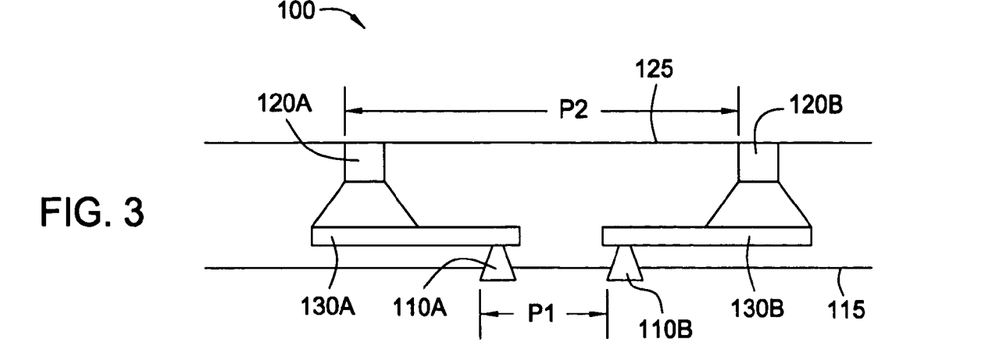
FIG. 3 is a partial cross sectional view of an interface wafer according to one embodiment of the invention.

FIG. 3 is a partial cross sectional view of an interface wafer 100 according to one embodiment of the invention. As shown in FIG. 3, two contact pads 110A, 110B are disposed on the bottom surface 115 of the interface wafer 100 while two interface pads 120A, 120B are disposed on the top surface 125 of the interface wafer 100. The contact pads 110A and 110B are electrically connected to the interface pads 120A, 120B, respectively, by two pitch-relaxing connectors 130A, 130B disposed within the interface wafer 100. The pitch-relaxing connectors 130A, 130B extend the pitch P2 between adjacent interface wafer pads 120A, 120B to be much greater than the pitch P1 between corresponding adjacent contact pads 110A and 110B. Because the pitch P2 is relaxed (i.e., distance between adjacent pads is increased), the corresponding pitch of the probe needles on a probe card may also be relaxed, resulting in less stringent production requirement for the probe needles. Although the pitch P2 is shown as relaxed in one direction in FIG. 3, it is contemplated that the pitch may be relaxed in any other direction or any combination of directions as necessary to provide the desired distance between adjacent pads.

The interface wafer may be fabricated utilizing conventional semiconductor processing equipment. To further increase efficiency in production and reduce costs, the interface wafer may comprise the same semiconductor substrate as that of the device wafers, and the fabrication of the interface wafer may be carried out utilizing the same equipment utilized for fabricating the device wafers. Also, the interface wafers may be produced during typical idle periods between production periods of device wafers.

Figure 4A:
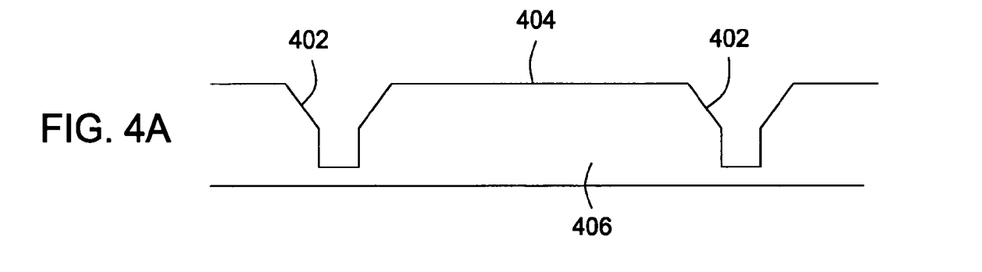
FIGS. 4A–4H are partial cross sectional views of a substrate illustrating a method for making an interface wafer according to one embodiment of the invention.

FIGS. 4A–4G are partial cross sectional views of a substrate illustrating a method for making an interface wafer 100 according to one embodiment of the invention. The method for making an interface wafer described herein utilizes various conventional semiconductor material processes that may require transfer of a semiconductor substrate between different processing equipment. It is understood that appropriate processing equipment is utilized to perform the individual steps of the method described herein. The fabrication of the interface wafer 100 begins with the formation of a plurality of interface-pad features 402 on a first surface 404 of a substrate 406, as shown in FIG. 4A. In one embodiment, the interface-pad features 402 are patterned directly on and etched from the first surface 404 of the substrate 406. In another embodiment, an oxide layer may be deposited over the first surface of the substrate and then etched to form the interface pad features. Persons skilled in the art will recognize other embodiments. The interface-pad features 402 may be arranged correspondingly to a desired pitch to accommodate a relaxed-pitch arrangement of the probe needles of a probe card to be utilized with the interface wafer 100 for testing the devices formed on a device wafer.

Figure 4B:
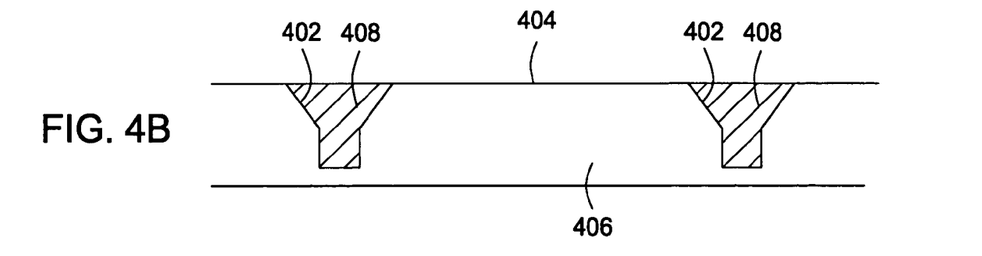
Figure 4C:
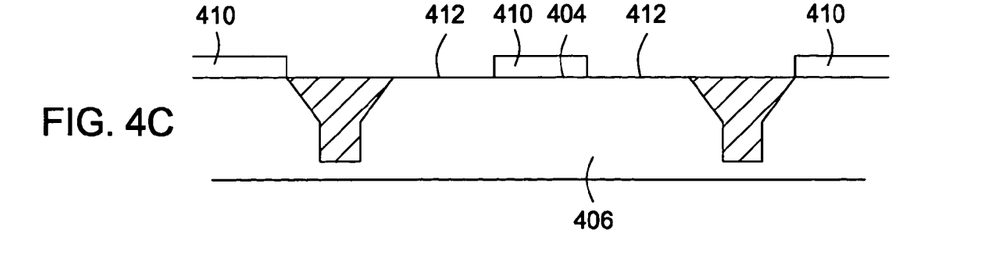
Figure 4D:
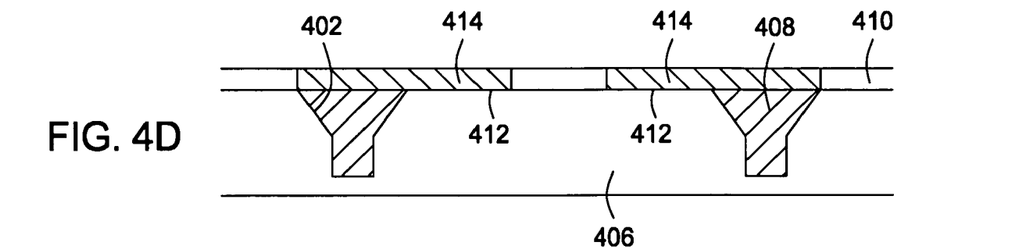

After formation of the interface-pad features 402, the interface-pad features 402 are filled with a conductive material 408 (e.g., aluminum or other conductive metals) through a metallization process, such as physical vapor deposition, chemical vapor deposition, etc. Any excess conductive material deposited over the first surface 404 is etched away by an etching process or otherwise removed, and the conductive material 408 remains only within the interface-pad features 402, as shown in FIG. 4B. After which, a first oxide layer 410 is deposited over the first surface 404 of the substrate 406. The first oxide layer 410 is patterned and etched to form connector features 412, as shown in FIG. 4C. The connector features 412 are then filled with a conductive material to form the pitch-relaxing connectors 414. Any excess conductive material deposited over the first oxide layer 410 is etched away by an etching process or otherwise removed, resulting in pitch-relaxing connectors 414 conductively connected to the conductive material 408 in the interface-pad features 402, as shown in FIG. 4D. The pitch-relaxing connectors 412 are arranged to extend from the interface-pad features 402 to locations where the contact pads are to be formed.

Figure 4E:
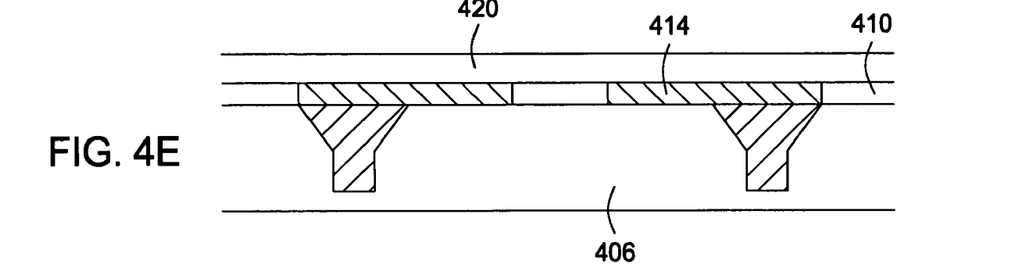

A second oxide layer 420 may be formed over the first oxide layer 410 and the pitch-relaxing connectors 414, as shown in FIG. 4E. As this stage in the fabrication of the interface wafer 100, the substrate 406 includes a layer of pitch-relaxing connectors 414 that are readily customizable for various device wafers having similar die sizes. The contact pads may be formed in particular desired arrangements to customize the resulting interface wafer for a particular device wafer. To increase efficiencies of interface wafer production for a particular probe card, a number of substrates may be processed to this stage during a production run period and stored until ready to be customized with a particular arrangement of contact pads. The second oxide layer 420 and the second surface 422 serve as protective surfaces of the components already formed on the substrate 406.

Figure 4F:
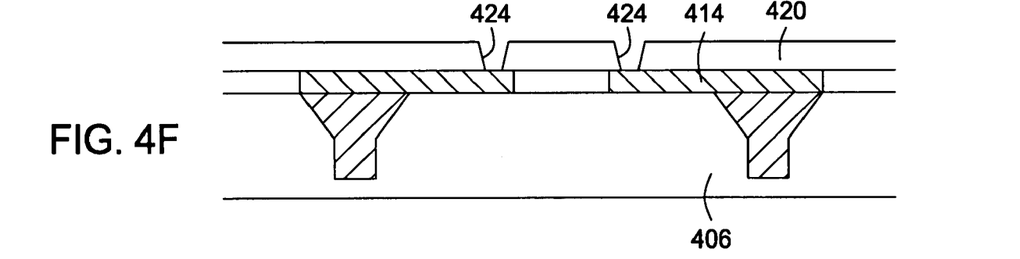
Figure 4G:
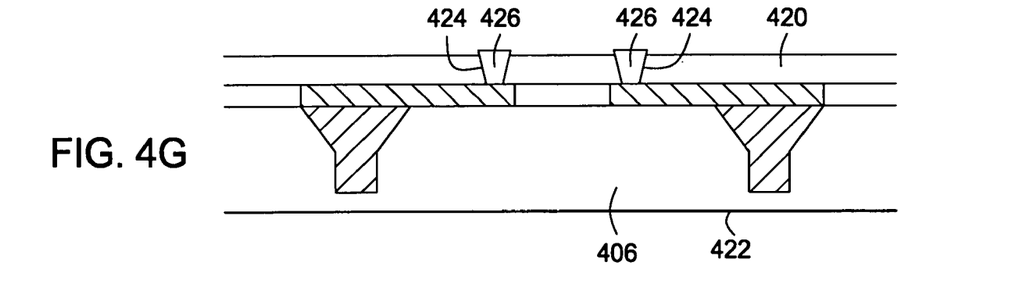

To customize the substrate 406 with a particular arrangement of contact pads, the second oxide layer 420 is patterned and etched accordingly to form a particular arrangement of contact-pad features 424, as shown in FIG. 4F. In one embodiment, the contact-pad features 424 may be arranged in a one-to-one correspondence, in a mirror image, with the device pads on a device wafer to be tested. In another embodiment, the contact-pad features are provided for a subset of each set of device pads on a device wafer. The contact-pad features 424 are filled with a conductive material to form the contact pads 426, as shown in FIG. 4G. A selective etching process or a selective polishing process (e.g., chemical-mechanical polishing process) may be utilized to form a protrusion of the contact pads 426 above the surface of the second oxide layer 420.

Figure 4H:
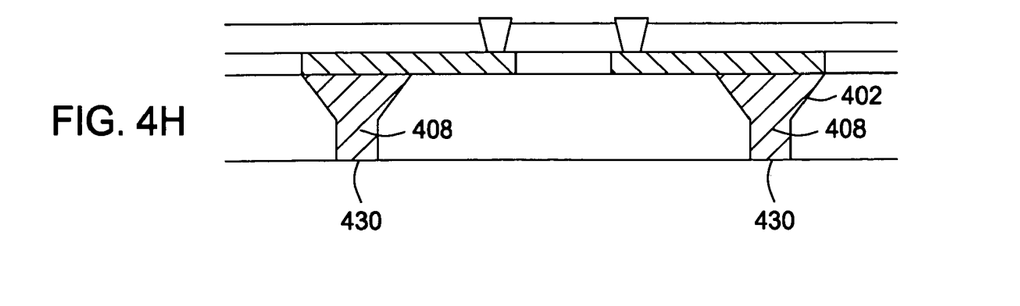

To complete fabrication of the interface wafer 100, the second surface 422 of the substrate 406 is removed (e.g., polished away utilizing a chemical-mechanical polishing process) to expose the conductive material 408 in the interface-pad features 402, which result in the formation of the interface pads 430, as shown in FIG. 4H. The interface pads 430 provide the electrical connection to the probe needles of a probe card during a testing process of a device wafer.

Figure 5:
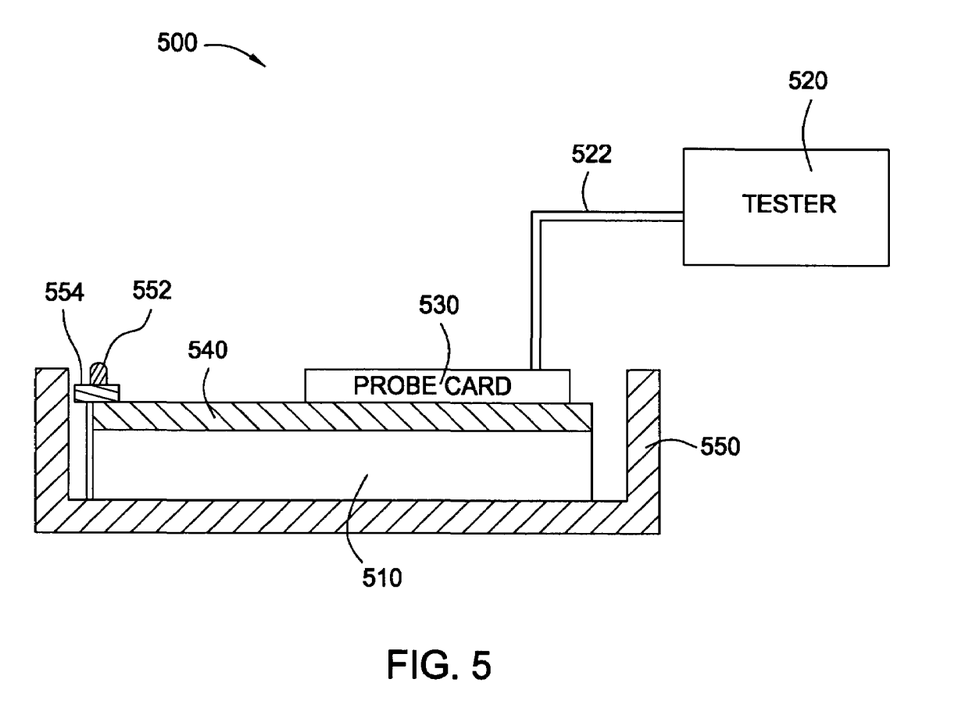
FIG. 5 is a block diagram illustrating a system 500 for testing a device wafer 510 having a plurality of devices formed thereon.

FIG. 5 is a block diagram illustrating a system 500 for testing a device wafer 510 having a plurality of devices formed thereon. Generally, the system 500 includes a tester 520, a probe card 530, and an interface wafer 540. The tester 520 may comprise a computer running an application program for performing test operations. The tester 520 is connected to the probe card 530 through a connection cable 522. Typically, the tester 520 and the connection cable 522 provide a limited number of channels that may be tested at one time, and thus, to complete testing of all devices on a device wafer 510, multiple test runs may be required when one tester 520 provides an insufficient number of channels to test all devices at once. Alternatively, a plurality of testers 520 may be connected to a plurality of probe cards 530 to conduct testing on all devices on a device wafer 510 simultaneously.

The device wafer 510 may be positioned in a carrier 550, and the interface wafer 540 may be aligned and secured onto the device wafer 510 utilizing one or more alignment posts 552 and one or more clamps 554. The carrier 550 facilitates transportation of a device wafer 510 secured together with an interface wafer 540. The alignment posts 552 and the clamps 554 ensure that the contacts pads on the interface wafer 540 make proper physical contact with corresponding device pads on the device wafer 510 during a testing process. In one embodiment, three alignment posts 552 are positioned around an outer perimeter of the wafers corresponding to one or more orientation notches on the wafers, and three clamps 554 may be utilized to secure the interface wafer 540 onto the device wafer 510 in proper alignment during subsequent transportation and testing processes.

Conventional test processes may be performed utilizing the system 500. The interface wafer 540 reduces the number of touchdowns onto the device pads on the wafer to two touchdowns. All pre-fuse tests may be conducted with a first touchdown, and all post-fuse tests may be conducted with a second touchdown. Because multiple touchdowns onto the device pads on a wafer may damage the device pads, the interface wafer 540 reduces the chances of device pad damage.

In one embodiment, an interface wafer may be designed to be compatible with one or more designs of devices on a wafer. In designing the interface pads for such an interface wafer, a first mask for patterning the features for forming the interface pads may be designed by estimating the maximum number of chips or devices per wafer and the number of pads per chip or device. For a process node, or where designs will share the same probe card, the minimum and maximum pitch and pad sizes may be estimated to design a second mask for patterning the metal layer for forming the pitch-relaxing connectors. The first and second masks may be utilized for all considered device designs. To accommodate variations in the device designs considered, a device contact and bump mask may be customized for each device design.

By providing a larger amount of interface pads, a single type of probe card may potentially accommodate a greater variety of designs of device wafers having different chip size, chip count, and device pad counts. Also, the mask utilized for patterning the interface pad features and the mask for patterning the pitch-relaxing connectors may be re-used in manufacturing interface wafers that may be customized later.

Embodiments of the present invention reduce the growing cost of precision manufactured probe needles and probe cards needed for testing devices having smaller device feature sizes. Embodiments of the interface wafer may be manufactured utilizing idle capacity of the same equipment utilized to fabricate the device wafers. Conventional inexpensive masks may be employed in the fabrication of the interface wafers to reduce fabrication costs of the interface wafers. Thus, the interface wafers may be made with little cost. Because the pitch and size of the interface pads on the interface wafer is relaxed to allow greater tolerances for the probe needles on the probe card, the cost for manufacturing the probe card is substantially reduced. In some embodiments, the advantages provided by the interface wafer may result in substantial reduction in probe card manufacturing costs and the lead time required to obtain a probe card for a particular device design. The interface pads on the interface wafer may be standardized for different device designs and allow the same probe card to be reused for different device designs since only the contact pads on the interface wafer need to be customized for specific device designs. The interface wafer may be customized for a variety of similar device designs.

Furthermore, embodiments of the interface wafer provide an additional benefit of protecting the device pads on the device wafer by reducing and/or minimizing the number of touchdowns required to complete testing of the devices. The interface wafer absorbs most of the damages by the touchdowns during the testing process, and any damaged interface wafer may be discarded and replaced by another new interface wafer.

Interface Wafer for Parallel Testing of Devices on a Device Wafer

One embodiment of the invention provides an interface wafer comprising one or more routing layers which enable die level parallelism (e.g., by sharing tester channels) and tie address, commands, data, clock and power/reference lines of different dies together. With correct routings of signals, parallel write operations to all dies and sequential read operations of multiple dies may be achieved. Thus, all devices on a wafer may be tested with one single touch down, which is especially critical for conducting burn-in tests of devices at the wafer level in improving efficiency and increasing throughput of the testing system. Also, conventional probe card cost may be further reduced because the probe needle density may be further reduced and the probe card design complexity may also be reduced. Furthermore, multiple testers are no longer required to be tied to one probe card to conduct parallel testing of devices on a device wafer.

In the wafer testing industry, an increase in component level parallelism (i.e., ability to perform parallel testing of a plurality of components or dies) is generally needed to increase efficiencies and to achieve higher throughput per tester, which results in reduction of test cost. To increase component level parallelism, the tester channels are shared between multiple components. For memory ICs, several of the pins to a die that may be shared between all dies within a test group typically include the address pins, the data pins, the power/reference pins and the clock pins. For the command pins on the memory ICs, some command pins may be kept discrete while others may be shared within a test group.

In one embodiment of the invention, to increase throughput of a testing system for testing device wafers, the testing process may perform a parallel write operation to all components on the device wafer and a sequential read operation from all components within each test group sequentially. During a parallel write operation, the same data is written to the same address location with the same sequence to all components, and thus, in the write operation, all pins may be shared without any problem. During a sequential read operation, the same data is read from the same address location with the same sequence from all components. To maximize throughput, the data pins may be shared within a test group, but one or more command pins are kept discrete to allow sequencing of the components within a test group during read operations.

For example, for memory ICs, all components within a test group may share the same tester channels for the address pin, most of the command pins, the data pin, the power/reference pin and the clock pin. The command pins that are not shared may include LDQM and UDQM, which control the read masking functionality of the memory devices. The DM pins are utilized during the read operations to individually select a particular component to drive the shared data pin within a test group to avoid bus contention.

Figure 6:
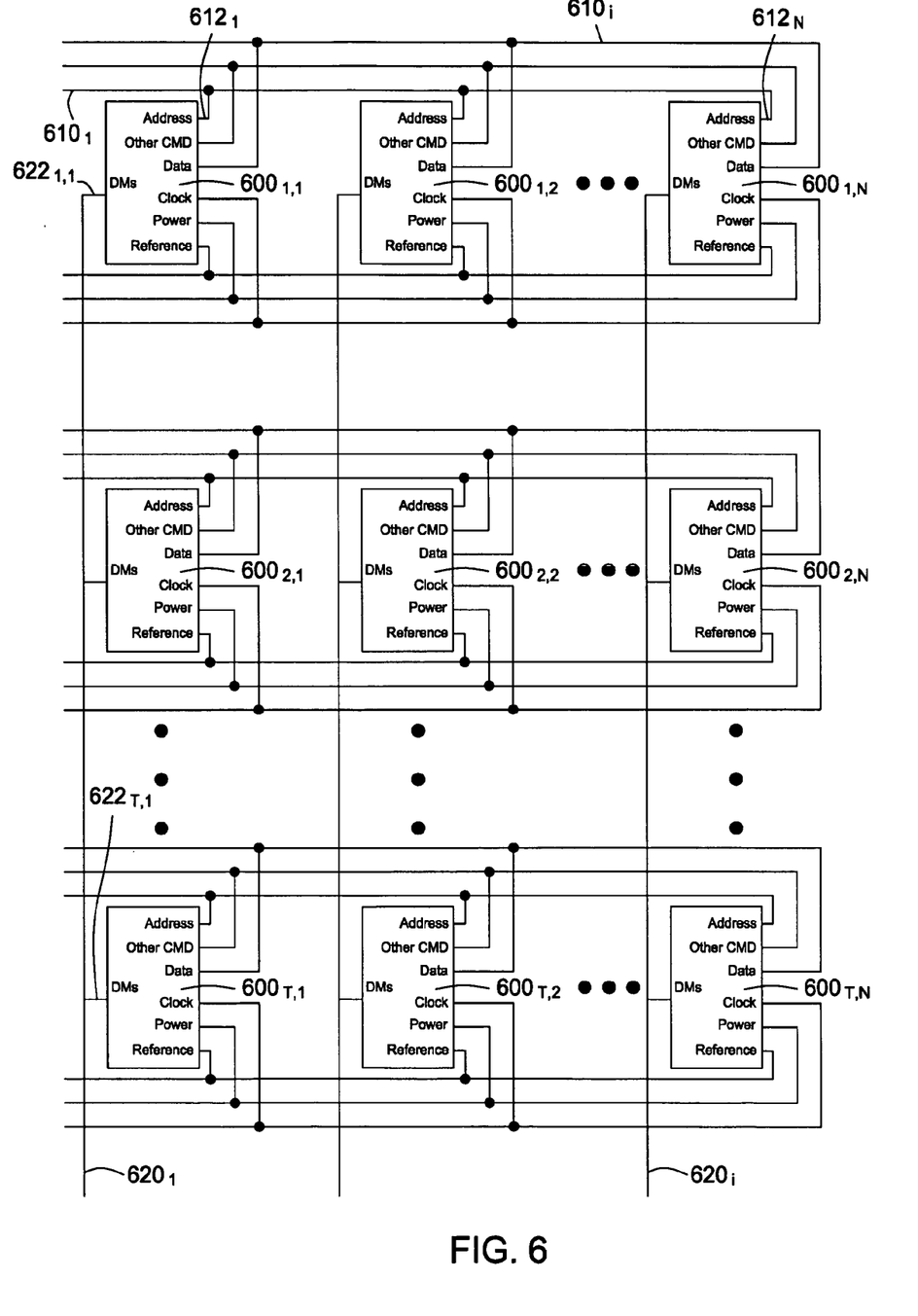
FIG. 6 is a schematic logical representation of a plurality of dies on a device wafer arranged in test groups for parallel testing.

FIG. 6 is a schematic logical representation of a plurality of dies on a device wafer arranged in test groups for parallel testing. To design the parallel test interface wafer, the number of test group (T) and the number of dies within a test group (N) are calculated. The total number of devices or components on a test board or device wafer may be defined as a set S, which may be subdivided to a number of test groups T. The number of test groups T may be determined by the number of data channels available on a tester (Dtest) and the number data pins per component (Dcomp), as expressed in the following equation:

$$T = INT(Dtest/Dcomp)$$

where T equals the maximum rounded down integer of the division operation.

The number of devices/components within a test group may be determined by dividing the total number of devices/components S by the number of test groups T, as expressed in the following equation:

$$N = S/T$$

where S is the number of total components on a test board and T is the number of test groups that a tester can support.

The dies $600_{T,N}$ on the wafer are topologically divided to T groups, with consideration given to achieve shared routing of address pin, data pin, power pin, reference pin, clock pin and all command pins except DMs within a test group on one or more metal connection layers.

As shown in FIG. 6, a plurality of first level connection lines $610_i$ connects the pins, except the DMs pin, of each die $600_{T,N}$ within each test group T. Each first level connection line $610_i$ connects one pin from each die $600_{T,N}$ within one test group T. For example, a first level connection line $610_1$ connects all of the address pins $612_1$ to $612_N$ of dies $600_{1,1}$ to $600_{1,N}$. The other pins of each die $600_{T,N}$ within a test group T are similarly connected by respective first level connection lines $610_i$. A plurality of second level connection lines $620_i$ connects the DMs pins $622_{T,N}$ of the dies $600_{T,N}$. Each second level connection line $620_i$ connects the DMs pin $622_{T,N}$ from one die of each test group with respectively ordered die from other test groups. For example, the second level connection line $620_1$ connects the DMs pin $622_{T,1}$ of dies $600_{1,1}$ to $600_{T,1}$.

In one embodiment, the first level connection lines $610_i$ may be utilized for routing in a first direction on the wafer (e.g., horizontal routing) while the second level connection lines $620_i$ may be utilized for routing in a second direction on the wafer (e.g., vertical routing). The first level connection lines and the second level connection lines allow the devices formed on the device wafer to be tested in parallel, i.e., one die from each test group is tested simultaneously with other respectively ordered dies from other test groups. Although embodiments shown describe a parallel test wafer interface having two levels of connection lines, other embodiments having one or more levels of connection lines (e.g., multi-level complex routing layers) are contemplated by the invention.

Figure 7:
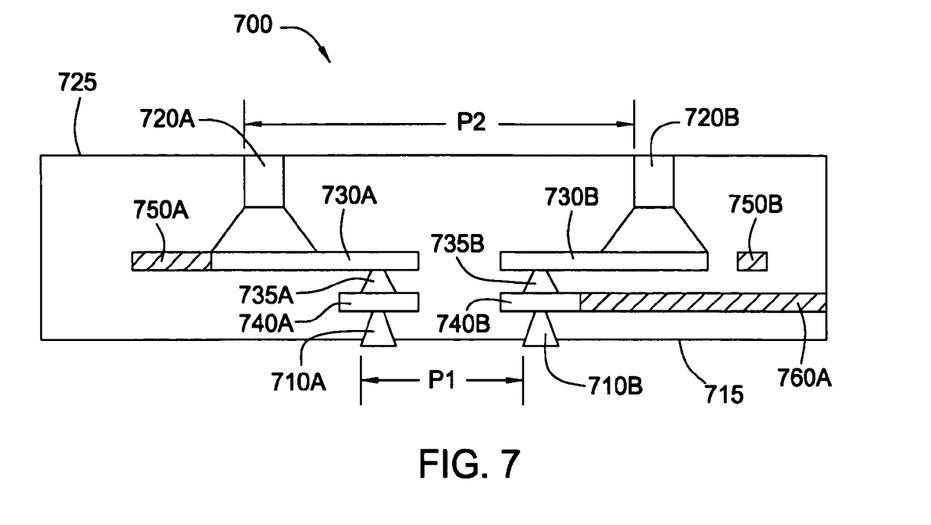
FIG. 7 is a partial cross sectional view of an interface wafer 700 according to one embodiment of the invention.

FIG. 7 is a partial cross sectional view of an interface wafer 700 according to one embodiment of the invention. As shown in FIG. 7, two contact pads 710A, 710B are disposed through a bottom surface 715 of the interface wafer 700 while two interface pads 720A, 720B are disposed through a top surface 725 of the interface wafer 700. The contact pads 710A and 710B are electrically connected to the interface pads 720A, 720B, respectively, by two pitch-relaxing connectors 730A, 730B, two metal layer connectors 735A, 735B and two routing layer connectors 740A, 740B, disposed within the interface wafer 700. The pitch-relaxing connectors 730A, 730B extend the pitch P2 between adjacent interface wafer pads 720A, 720B to be much greater than the pitch P1 between corresponding adjacent contact pads 710A and 710B. Because the pitch P2 is relaxed (i.e., distance between adjacent pads is increased), the corresponding pitch of the probe needles on a probe card may also be relaxed, resulting in less stringent production requirement for the probe needles. Although the pitch P2 is shown as relaxed in one direction in FIG. 7, it is contemplated that the pitch may be relaxed in any other direction or any combination of directions if necessary to provide the desired distance between adjacent pads. FIG. 7 also shows a first routing layer (or interconnect layer) 750 having interconnect lines 750A, 750B, and a second routing layer 760 having an interconnect line 760A. The routing layers 750, 760 may be utilized to selectively connect desired components to achieve desired routing (e.g., horizontal routing and vertical routing).

Figure 8:
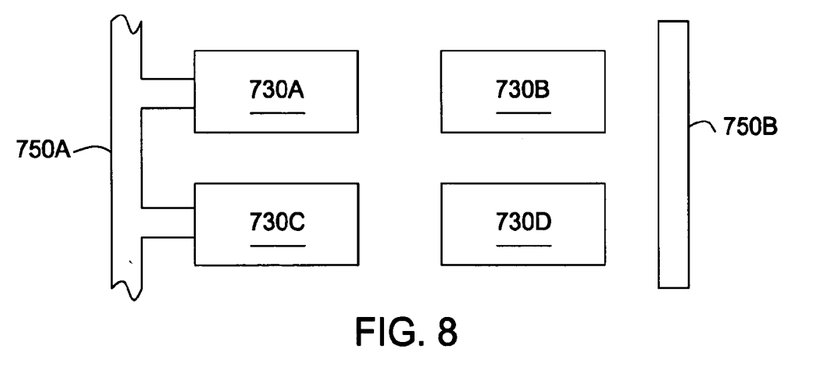
FIG. 8 is a partial plan view of a first routing layer 750 illustrating one embodiment of interconnect lines 750A and 750B.

FIG. 8 is a partial plan view of a first routing layer 750 illustrating one embodiment of interconnect lines 750A and 750B. As shown, the interconnect line 750A electrically connects the pitch-relaxing connectors 730A and 730C while the interconnect line 750B bypasses pitch-relaxing connectors 730B and 730D. In one embodiment, the first routing layer or interconnect layer 750 may be patterned and formed at the same time as the formation of the pitch-relaxing connectors 730. A plurality of pitch relaxing connectors 730 (and respective interface pads 720) may be electrically connected by the first routing layer 750. In one embodiment, the first interconnect lines 750 provide electrical connection between interface pads that are to be connected to DMs pins of respectively ordered dies from each group of dies (e.g., the first routing layer may correspond to the second level connection lines $620_i$ as shown in FIG. 6).

Figure 9:
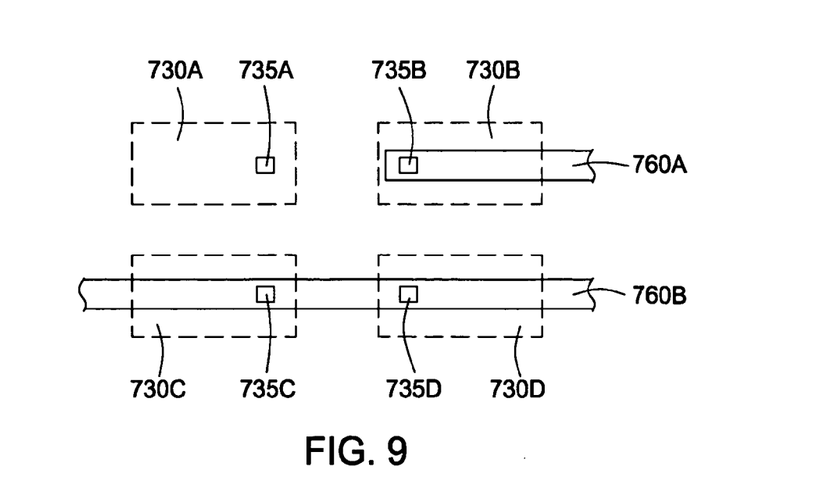
FIG. 9 is a partial plan view of a second routing layer 760 illustrating one embodiment of interconnect lines 760A and 760B.

FIG. 9 is a partial plan view of a second routing layer 760 illustrating one embodiment of interconnect lines 760A and 760B. As shown, the interconnect line 760A is electrically connected through the metal layer connector 735B to the pitch-relaxing connector 730B while the interconnect line 760B are electrically connected to the pitch-relaxing connectors 730C and 730D through the metal layer connector 735C, 735D. The second interconnect lines 760 may provide electrical connection between one or more pluralities of contact pads for contacting respective pins on respective devices (e.g., the second interconnect lines 760 may correspond to the first level connection line $610_i$ connects respective pins from each die $600_{T,N}$ within one test group T as shown in FIG. 6).

The interface wafer 700 may be fabricated utilizing conventional semiconductor processing equipment utilizing similar semiconductor processes described above in relation to the interface wafer 100. Additional processing may be performed as needed to form the first and second routing layers and the respectively associated interconnect lines. To further increase efficiency in production and reduce costs, the interface wafer may comprise the same semiconductor substrate as that of the device wafers, and the fabrication of the interface wafer may be carried out utilizing the same equipment utilized for fabricating the device wafers. Also, the interface wafers may be produced during typical idle periods between production periods of device wafers.

Embodiments of the parallel test interface wafer 700 may be utilized in a testing system such as one illustrated in FIG. 5, in which the interface wafer 540 is replaced by the parallel test interface wafer 700. The tester 520 may be configured to run a parallel testing process for testing the devices on the device wafer 510. In one embodiment, the interface wafer for parallel testing of devices formed on a device wafer achieves higher throughput in production testing by enabling testing all devices on a wafer with a single touchdown. Also, embodiments of the interface wafer for parallel testing of devices significantly improve efficiency in conducting burn-in tests performed at the wafer level.

Test Circuitry Wafer

One embodiment of the invention provides a test circuitry wafer incorporating the DFT features that can be moved off-chip, which results in freeing up substrate space/area previously occupied by on-chip DFT features. In one embodiment, the DFT features are implemented on a separate wafer which serves as an interface between the wafer interface probe card and the device wafer. By incorporating the DFT features in a test circuitry wafer, the test circuitry wafer may be utilized for different device designs. Once the test circuitry wafer is designed and verified, there is no need to allocate additional resources to modify, verify and layout for different device designs. Another advantage provided by a separate test circuitry wafer is that, since there will be silicon area equivalent to a whole die, there will be more than enough space to use relaxed routing and process rules which will lower mask cost. Furthermore, additional DFT features may be implemented in the test circuitry wafer without impacting the device/chip size or performance since the DFT features are removed from the devices (i.e., not on-chip).

Removal of some or all DFT features from the devices on the wafer to the test circuitry wafer reduces the substrate areas and routing space allocated to accommodate the DFT features. An additional benefit provided by moving the DFT features off-chip is that the device size may be reduced, and resulting in potentially more devices being formed on the same size wafer. Furthermore, the devices may be designed to allow stronger power rails, and signal routing between components within each device may be designed more efficiently because of the removal of the DFT features from the devices. Another advantage achieved by removing the DFT feature off-chip is that the performance impact to normal operation caused by the on-chip DFT blocks is minimized or substantially reduced because the DFT features are moved off-chip.

In one embodiment, a test circuitry wafer which includes DFT features that are moved off-chip may be utilized in conjunction with an interface wafer described herein to conduct tests of devices formed on a device wafer. Embodiments of the invention may reduce chip size, time to market and normal operation performance impact. Embodiments of the test circuitry wafer may be shared among different wafers within a general device design and potentially across different device designs.

In another embodiment, the test circuitry wafer may include features of the interface wafer described above. In such embodiment, the test circuitry wafer also serves as an interface between a device wafer and a probe card. Such embodiment may also provide further reduction in manufacturing cost for the test circuitry wafer and the interface wafer.

To design the test circuitry wafer, the DFT blocks that can be moved off-chip are first identified. The DFT blocks may be moved off-chip with or without modifications. The DFT features that cannot be moved off-chip are also identified. Some DFT features may not be moved off-chip because of schedule, performance or die size impact. The DFT features may be designed for off-chip implementation utilizing relaxed process rules since each set of DFT features may utilize a substrate area on the test circuitry wafer that is about the same as the size of one die on the device wafer. In one embodiment, the test circuitry wafer may be designed to accommodate a plurality of similar device wafer designs by including additional flexibility in terms of data width and address space which may be controlled directly by the tester via specified test channels.

Figure 10:
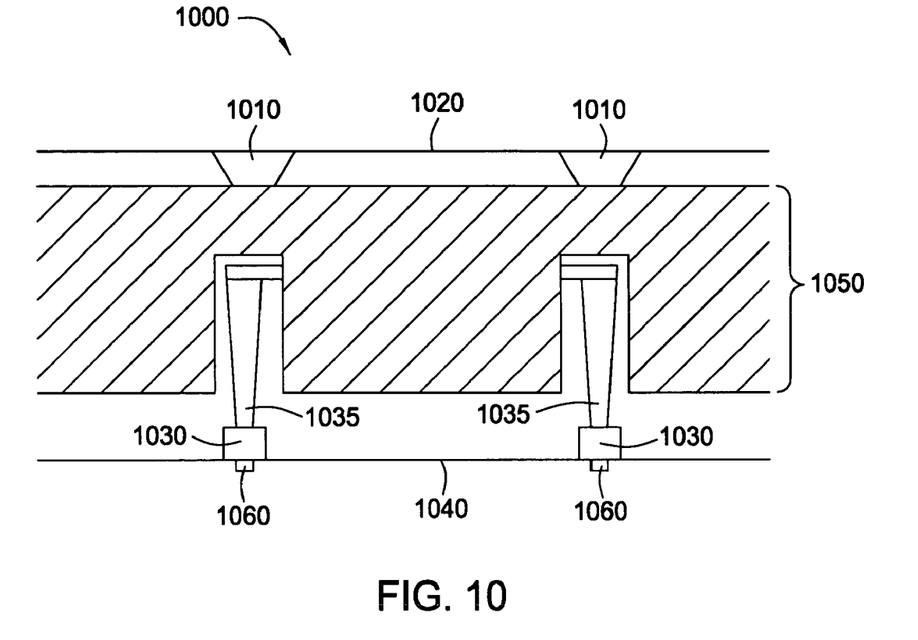
FIG. 10 is a partial cross sectional view of a test circuitry wafer 1000 according to one embodiment of the invention.

FIG. 10 is a partial cross sectional view of a test circuitry wafer 1000 according to one embodiment of the invention. Illustratively, the partial cross section shows the region corresponding to one die on a device wafer to be tested. In one embodiment, the test circuitry wafer 1000 generally comprises a plurality of probe card contact pads 1010 disposed on a first surface 1020 of the test circuitry wafer 1000, a plurality of interface wafer contact pads 1030 disposed on a second surface 1040 and one or more DFT features 1050 disposed in the test circuitry wafer 1000. The one or more DFT features 1050 may be electrically connected to at least one of the probe card contact pads 1010 and the interface wafer contact pads 1030. The one or more DFT features may be connected to the interface wafer contact pads 1030 through a plurality of contact connectors 1035. The test circuitry wafer 1000 may have as many sets of DFT features 1050 and contact pads 1010, 1030 to the interface wafer and the probe card as the number of dies on the device wafer. To enhance contact with an interface wafer, the test circuitry wafer 1000 may include bumps 1060 deposited on the interface wafer contact pads 1030.

Figure 11:
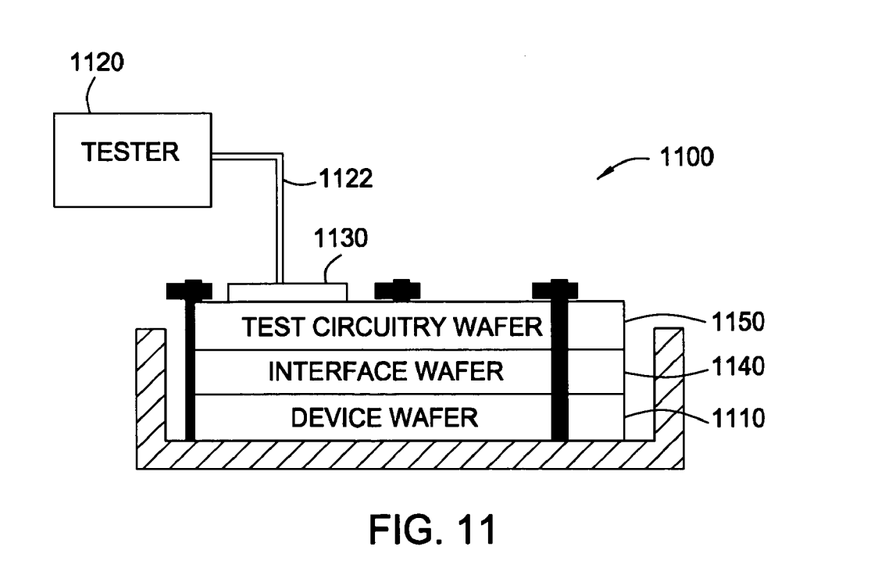
FIG. 11 is a block diagram illustrating a system 1100 for testing a device wafer 1110 having a plurality of devices formed thereon.

FIG. 11 is a block diagram illustrating a system 1100 for testing a device wafer 1110 having a plurality of devices formed thereon. Generally, the system 1100 includes a tester 1120, a probe card 1130, an interface wafer 1140 and a test circuitry wafer 1150. The tester 1120 may comprise a computer running an application program for performing test operations. The tester 1120 is connected to the probe card 1130 through a connection cable 1122. Testing processes may be performed on device wafers utilizing the testing system 1100 in a similar fashion as described above for the testing system 500 in FIG. 5.

Figure 12:
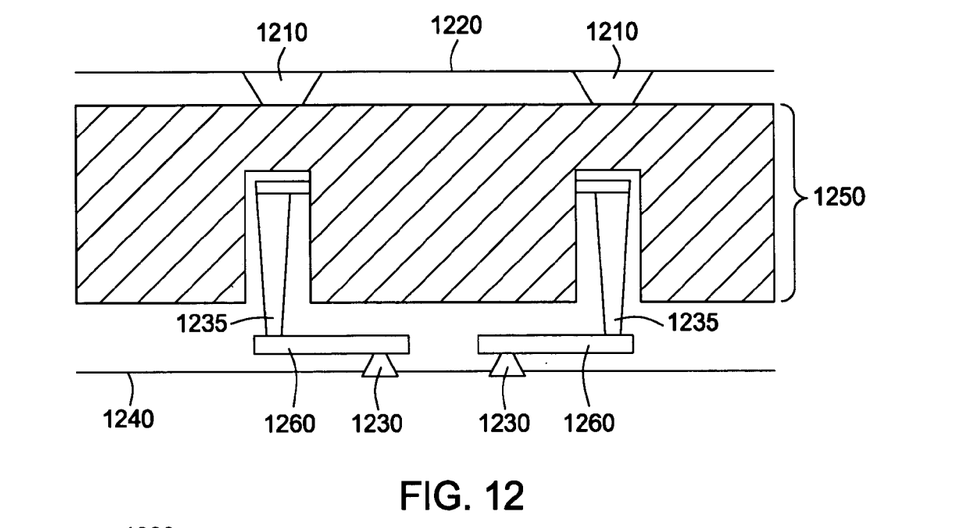
FIG. 12 is a partial cross sectional view of a test circuitry wafer 1200 according to another embodiment of the invention.

FIG. 12 is a partial cross sectional view of a test circuitry wafer 1200 according to another embodiment of the invention. The embodiment shown in FIG. 12 may be utilized in a test system such as one described in FIG. 5 in which the test circuitry wafer 1200 replaces the interface wafer 540. In the embodiment shown in FIG. 12, the test circuitry wafer 1200 includes features of the interface wafer described above. In such embodiment, the test circuitry wafer 1200 also serves as an interface between a device wafer and a probe card. Such embodiment may also provide further reduction in manufacturing cost for the test circuitry wafer and the interface wafer because only one wafer is provided instead of two wafers.

As shown in FIG. 12, the test circuitry wafer 1200 generally comprises a plurality of probe card contact pads 1210 disposed on a first surface 1220 of the test circuitry wafer 1200, a plurality of device wafer contact pads 1230 disposed on a second surface 1240 and one or more DFT features 1250 disposed in the test circuitry wafer 1200. The device wafer contact pads 1230 are disposed at about the same pitch as the device pads on the device wafer. The probe card contact pads 1210, however, are provided in a relaxed pitch as compared to the device wafer contact pads 1230. The one or more DFT features 1250 may be connected to the device wafer contact pads 1230 through a plurality of contact connectors 1235 which are connected to a plurality of pitch-relaxing connectors 1260, respectively.

Figure 13:
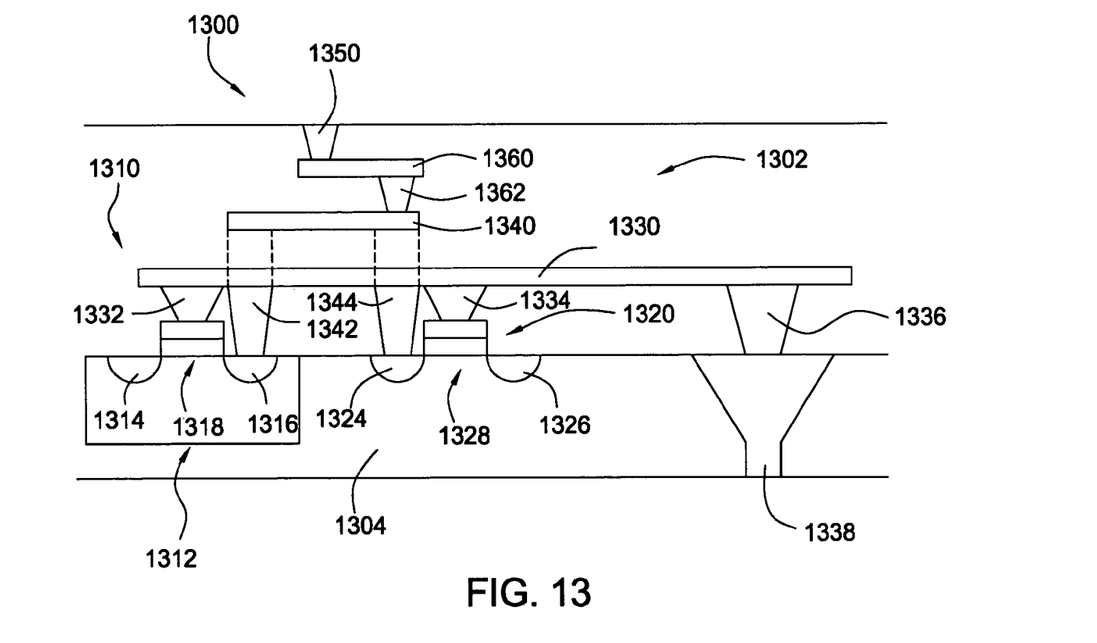
FIG. 13 is a cross sectional view of a DFT component incorporated in a test circuitry wafer according to one embodiment of the invention.

FIG. 13 is a cross sectional view of a DFT component incorporated in a test circuitry wafer 1300 according to one embodiment of the invention. As shown in FIG. 13, the DFT component 1302 includes a P-type transistor 1310 and an N-type transistor 1320. The P-type transistor 1310 may be formed in an n-doped region 1312 formed in the test circuitry wafer substrate 1304 and includes a source 1314, a drain 1316 and a gate 1318. The N-type transistor 1320 may be formed on the test circuitry wafer substrate 1304 (e.g., p-doped region) and include a source 1324, a drain 1326 and a gate 1328. The gate 1318 of the P-type transistor 1310 and the gate 1328 of the N-type transistor 1320 may be connected to a first metal routing layer 1330 through gate contacts 1332 and 1334, respectively. The probe card contact pad 1338 is connected to the first metal routing layer 1330 through another contact 1336. A second metal routing layer 1340 may be connected to the drain 1316 of the P-type transistor 1310 and the source 1324 of the N-type transistor 1320 through contacts 1342, 1344. The device wafer interface pad 1350 may be connected to the second metal routing layer 1340 through a pitch-relaxing connector 1360 and another contact 1362. Alternatively, the device wafer interface pad 1350 may be connected directly to the second metal routing layer 1340. The source 1314 of the P-type transistor 1310 may be connected to a voltage Vint through another metal routing layer (not shown), and the drain 1326 of the N-type transistor 1320 may be connected a ground though yet another metal routing layer (not shown). For illustrative purposes, the DFT component 1302 as shown in FIG. 13 comprises a NOT gate. In practice, the test circuitry wafer may include a variety of DFT features and components as needed to perform the desired tests.

In one embodiment, the test circuitry wafer may be manufactured utilizing conventional semiconductor processing equipment. First, starting with a substrate wafer, a plurality of wafer interface contact pads are formed on pitch to contact with the probe card interface pads on an interface wafer such as the interface wafer described above. Next, a full set of layers, including features such as wells, active areas and metal connectors, is formed to implement the targeted DFT features. After the DFT features have been formed, a plurality of contact connectors are formed to connect the DFT feature blocks to the wafer interface contact pads which are subsequently formed. After the wafer interface contact pads have been formed, the bottom of the wafer may be thin down and/or chemical-mechanically polished until the probe card contact pads are exposed. Optionally, a bump layer may be deposited on exposed wafer interface contact pads to enhance contact with the interface wafer.

To further improve efficiencies, the test circuitry wafer may be manufactured utilizing the same equipment being utilized to manufacture the device wafers during down periods between device wafer production runs. Generally, semiconductor processing similar to those described above for manufacturing the interface wafer may be employed to manufacture the test circuitry wafer.

While the foregoing is directed to embodiments of the present invention, other and further embodiments of the invention may be devised without departing from the basic scope thereof, and the scope thereof is determined by the claims that follow.

What is claimed is:

1. An apparatus for testing a device wafer having a plurality of devices formed thereon, comprising:
    an interface wafer having a first surface and a second surface, the interface wafer comprising:
        a plurality of contact pads disposed on the first surface for contacting a plurality of device pads on the device wafer;
        a plurality of interface pads disposed on the second surface for contacting probe needles on a probe card, wherein the plurality of interface pads are electrically connected to the plurality of contact pads;
        a first interconnect layer having one or more first interconnect lines, each interconnect line electrically connecting a respective first set of contact pads, wherein the first interconnect layer is disposed within the interface wafer; and
        a second interconnect layer, disposed within the interface wafer, having one or more second interconnect lines, each second interconnect line electrically connecting a respective second set of contact pads.

2. The apparatus of claim 1, wherein the plurality of interface pads are disposed in a relaxed-pitch arrangement as compared to the plurality of contact pads and wherein the plurality of contact pads are disposed at a first pitch corresponding to a device-pad pitch on the wafer.

3. The apparatus of claim 2, wherein the interface wafer further comprises a plurality of pitch-relaxing connectors electrically connected to the plurality of interface pads and the plurality of contact pads.

4. The apparatus of claim 2, further comprising:
the probe card having probe needles, wherein the probe needles are disposed in the same relaxed-pitch arrangement corresponding to the plurality of interface pads.

5. The apparatus of claim 1, wherein the plurality of interface pads are disposed in a relaxed-pitch arrangement as compared to the plurality of contact pads.

6. The apparatus of claim 1, wherein the interface wafer further comprises one or more design-for-test components disposed in connection with at least one of the contact pad and interface pads.

7. The apparatus of claim 1, wherein the plurality of contact pads are grouped into sets corresponding to device sets on the device wafer and wherein at least one first interconnect line is connected to each device set of a group of devices, via the respectively same device pad of each device set.

8. The apparatus of claim 1, further comprising:
a tester connected to the probe card for controlling test operations.

9. The apparatus of claim 1, further comprising:
a carrier for transporting the interface wafer with the device wafer, wherein the carrier includes one or more alignment posts for aligning the interface wafer on the device wafer and one or more clamps for securing the interface wafer on the device wafer.

10. The apparatus of claim 1,
wherein the plurality of contact pads are grouped into sets corresponding to device sets on the device wafer;
wherein at least one first interconnect line is connected to each device set of a first group of devices;
wherein at least one second interconnect line is connected to each device set of a second group of devices; and
wherein the first group of devices and the second group of devices includes at least one device in common.

11. An apparatus for testing a device wafer, comprising:
an interface wafer having a first surface and a second surface, the interface wafer comprising:
  a plurality of contact means, disposed on the first surface, for contacting a plurality of device pads on the device wafer;
  a plurality of interface means, disposed on the second surface, for contacting probe needles on a probe card;
  one or more first interconnect means, each electrically connecting a respective first set of contact means, wherein the one or more first interconnect means are disposed within the interface wafer; and
  one or more second interconnect means, disposed within the interface wafer, each electrically connecting a respective second set of contact means.

12. The apparatus of claim 11, wherein the plurality of interface means are disposed in a relaxed-pitch arrangement and wherein the plurality of contact means are disposed at a first pitch corresponding to a device-pad pitch on the wafer.

13. The apparatus of claim 12, wherein the interface wafer further comprises a plurality of pitch-relaxing means for electrically connecting the plurality of interface means and the plurality of contact means.

14. The apparatus of claim 13, further comprising:
the probe card having probe needles, wherein the probe needles are disposed in the same relaxed-pitch arrangement corresponding to the plurality of interface means.

15. The apparatus of claim 11, wherein the interface wafer further comprises one or more design-for-test components disposed in connection with at least one of the contact means and interface means.

16. The apparatus of claim 11, further comprising:
a carrier means for transporting the interface wafer with the device wafer, the carrier means having one or more alignment means for aligning the interface wafer on the device wafer and one or more clamping means for securing the interface wafer on the device wafer.

17. The apparatus of claim 11, wherein the plurality of contact means are grouped into sets corresponding to device sets on the device wafer and wherein at least one first interconnect means is connected to each device set of a group of devices, via the respectively same device pad of each device set.

18. The apparatus of claim 11,
wherein the plurality of contact means are grouped into sets corresponding to device sets on the device wafer;
wherein at least one first interconnect means is connected to each device set of a first group of devices; and
wherein at least one second interconnect means is connected to each device set of a second group of devices; and
wherein the first group of devices and the second group of devices includes at least one device in common.

* * * * *